(12) United States Patent
Uno et al.

(10) Patent No.: US 8,956,787 B2
(45) Date of Patent: Feb. 17, 2015

(54) REFLECTIVE MASK BLANK FOR EUV LITHOGRAPHY AND PROCESS FOR PRODUCING THE SAME

(75) Inventors: Toshiyuki Uno, Tokyo (JP); Kazuyuki Hayashi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 215 days.

(21) Appl. No.: 13/598,837

(22) Filed: Aug. 30, 2012

(65) Prior Publication Data
US 2012/0322000 A1    Dec. 20, 2012

Related U.S. Application Data

(63) Continuation of application No. PCT/JP2011/054380, filed on Feb. 25, 2011.

(30) Foreign Application Priority Data

Mar. 2, 2010    (JP) .................................. 2010-045059

(51) Int. Cl.
*G03F 1/24* (2012.01)
*G03F 1/46* (2012.01)
(Continued)

(52) U.S. Cl.
CPC .. *G03F 1/24* (2013.01); *G03F 1/46* (2013.01); *C23C 14/0036* (2013.01); *G03F 1/38* (2013.01); *G03F 7/20* (2013.01); *G03F 1/84* (2013.01)
USPC ............... 430/4; 430/5; 430/311; 204/192.28

(58) Field of Classification Search
CPC .......... G03F 1/24; G03F 7/20; C23C 14/0036
USPC .............................. 430/4–5, 311; 204/192.28
See application file for complete search history.

(56) References Cited

U.S. PATENT DOCUMENTS 7,230,695 B2    6/2007  Ikuta et al.
7,390,596 B2    6/2008  Ishibashi et al.
(Continued)

FOREIGN PATENT DOCUMENTS

JP    2004-006798    1/2004
JP    2006-228767    8/2006
(Continued)

OTHER PUBLICATIONS

U.S. Appl. No. 14/288,908, filed May 28, 2014, Hayashi.
(Continued)

*Primary Examiner* — Mark F Huff
*Assistant Examiner* — John S Ruggles
(74) *Attorney, Agent, or Firm* — Oblon, Spivak, McClelland, Maier & Neustadt, L.L.P.

(57) ABSTRACT

To provide an EUV mask blank provided with a low reflective layer, which has excellent properties as an EUV mask blank. A reflective mask blank for EUV lithography comprising a substrate, and a reflective layer for reflecting EUV light, an absorber layer for absorbing EUV light and a low reflective layer to an inspection light (wavelength: 190 to 260 nm) for a mask pattern, formed in this order on the substrate, wherein the low reflective layer has a stacked structure having a first layer containing at least 95 at % in total of silicon (Si) and nitrogen (N), and a second layer containing at least 95 at % in total of tantalum (Ta), oxygen (O) and nitrogen (N) or a second layer containing at least 95 at % in total of tantalum (Ta) and nitrogen (N), stacked in this order from the absorber layer side.

21 Claims, 2 Drawing Sheets

(51) Int. Cl.
*G03F 7/20* (2006.01)
*C23C 14/34* (2006.01)
*C23C 14/00* (2006.01)
*G03F 1/38* (2012.01)
*G03F 1/84* (2012.01)

(56) References Cited

U.S. PATENT DOCUMENTS

| | | |
|---|---|---|
| 7,678,511 B2 | 3/2010 | Ikuta et al. |
| 7,712,333 B2 | 5/2010 | Uno et al. |
| 7,713,666 B2 | 5/2010 | Hayashi et al. |
| 7,718,324 B2 | 5/2010 | Hayashi et al. |
| 7,736,821 B2 | 6/2010 | Hayashi et al. |
| 7,833,682 B2 | 11/2010 | Hayashi et al. |
| 7,855,036 B2 | 12/2010 | Hayashi et al. |
| 7,906,259 B2 | 3/2011 | Hayashi et al. |
| 7,960,077 B2 | 6/2011 | Ikuta et al. |
| 7,981,573 B2 | 7/2011 | Ishibashi et al. |
| 8,003,282 B2 | 8/2011 | Hayashi et al. |
| 8,026,024 B2 | 9/2011 | Hashimoto |
| 8,029,950 B2 | 10/2011 | Hayashi et al. |
| 8,088,538 B2 | 1/2012 | Hayashi et al. |
| 8,137,872 B2 | 3/2012 | Hayashi |
| 8,168,352 B2 | 5/2012 | Hayashi et al. |
| 8,288,062 B2 | 10/2012 | Hayashi et al. |
| 2002/0092763 A1* | 7/2002 | Denning et al. ......... 204/192.17 |
| 2005/0208389 A1* | 9/2005 | Ishibashi et al. ................. 430/5 |
| 2006/0251973 A1 | 11/2006 | Takaki et al. |
| 2007/0087578 A1 | 4/2007 | Sugiyama et al. |
| 2009/0226826 A1* | 9/2009 | Nozawa ............................ 430/5 |

FOREIGN PATENT DOCUMENTS

| | | |
|---|---|---|
| JP | 2006-237192 | 9/2006 |
| JP | 2007-335908 | 12/2007 |
| JP | 2008-070799 | 3/2008 |
| JP | 2009-210802 | 9/2009 |
| JP | 2009-252788 | 10/2009 |
| WO | WO 2009/154238 | 12/2009 |
| WO | WO 2010/007955 | 1/2010 |

OTHER PUBLICATIONS

International Search Report issued Apr. 5, 2011 in PCT/JP2011/054380 filed Feb. 25, 2011.
U.S. Appl. No. 13/739,373, filed Jan. 11, 2013, Hayashi.
U.S. Appl. No. 13/775,412, filed Feb. 25, 2013, Hayashi.
U.S. Appl. No. 13/956,691, filed Aug. 1, 2013, Hayashi, et al.

* cited by examiner

REFLECTIVE MASK BLANK FOR EUV LITHOGRAPHY AND PROCESS FOR PRODUCING THE SAME

TECHNICAL FIELD

The present invention relates to a reflective mask blank for EUV (Extreme Ultra Violet) lithography (in this specification, hereinafter referred to also as an "EUV mask blank") to be used for e.g. production of semiconductors, a process for producing such a blank, a reflective mask for EUV lithography obtained by patterning the blank, and a process for producing a semiconductor integrated circuit by means of the reflective mask.

BACKGROUND ART

Heretofore, in the semiconductor industry, a photolithography method employing visible light or ultraviolet light has been used as a technique to transfer a fine pattern required to form an integrated circuit of a fine pattern on e.g. a Si substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (wavelength: 193 nm) is employed, about 45 nm is presumed to be the limit. Under the circumstances, as an exposure technique for the next generation employing an exposure wavelength shorter than 45 nm, EUV lithography is expected to be prospective, which is an exposure technique employing EUV light having a wavelength further shorter than ArF laser. In this specification, EUV light means light ray having a wavelength within a soft X-ray region or within a vacuum ultraviolet region, specifically light ray having a wavelength of from about 10 to 20 nm, particularly about 13.5 nm±0.3 nm.

EUV light is likely to be absorbed by all kinds of substances, and the refractive indices of substances at such a wavelength are close to 1, whereby it is not possible to use a conventional refractive optical system like photolithography employing visible light or ultraviolet light. Therefore, in EUV lithography, a reflective optical system, i.e. a reflective photomask and mirror, is employed.

A mask blank is a stacking structure before being subjected to pattering, to be used for the production of a photomask. In the case of an EUV mask blank, it has a structure wherein a reflective layer to reflect EUV light and an absorber layer to absorb EUV light, are formed in this order on a substrate made of e.g. glass. As the reflective layer, it is common to use a multilayer reflective film having a high refractive index layer and a low refractive index layer alternately stacked to have the light reflectance improved when the layer surface is irradiated with EUV light. For the absorber layer, a material having a high absorption coefficient to EUV light, specifically e.g. a material containing Ta or Cr as the main component, is used.

On the absorber layer of the EUV mask blank, a low reflective layer to a mask pattern inspection light is usually formed. In order to detect the presence or absence of a defect of pattern after the formation of a mask pattern, a light ray which has the wavelength region of deep ultraviolet light (190 nm to 260 nm) is employed. In the pattern inspection employing the light ray having the above-mentioned wavelength region, presence or absence of the defect of pattern is examined by the difference of reflectance between an area where the low reflective layer and the absorber layer have been removed by a patterning process and an area where the low reflective layer and the absorber layer remain, namely, the contrast of reflected light at the surfaces of these areas. In order to increase the sensitivity of the detection of mask pattern, the contrast is required to be increased. For this purpose, it is usually required that the low reflective layer has a low reflectance at the above-mentioned wavelength region, namely, the reflectance at the wavelength region is 15% or less.

Patent Document 1 discloses that it is preferred to form a low reflective layer comprising an oxide of tantalum-boron alloy (TaBO) or an oxynitride of tantalum-boron alloy (TaBNO) on an absorber layer comprising a nitride of tantalum-boron alloy (TaBN) since the reflectance at the wavelength region (190 nm to 260 nm) of mask pattern inspection light is thereby low.

Patent Document 2 and 3 disclose that it is preferred to form a low reflective layer comprising a metal, silicon (Si), oxygen (O) and nitrogen (N) on an absorber layer in order to adjust the reflectance at the wavelength region (190 nm to 260 nm) of mask pattern inspection light.

In any of Patent Document 1 to Patent Document 3, a layer composed of an oxide or a layer composed of an oxynitride is used as the low reflective layer. This is for the purpose of adding oxygen to the low reflective layer to improve the low reflective function at the wavelength in the vicinity of from 190 to 260 nm. On the other hand, however, when a layer composed of an oxide or a layer composed of oxynitride is employed as the low reflective layer, there is a problem of a decrease in etching rate as described below.

At the time of production of a mask for EUVL, a dry etching process is employed usually when a pattern is formed in an absorber layer and a low reflective layer, and as the etching gas, a chlorine type gas (or a mixed gas containing a chlorine type gas) (herein after collectively referred to as a chlorine type gas) or a fluorine gas (or a mixed gas containing a fluorine type gas) (hereinafter collectively referred to as a fluorine type gas) is usually used. When a film containing Ru or a Ru compound is formed as a protective layer on a reflective layer for the purpose of preventing damage to the reflective layer by etching process, a chlorine type gas is mainly used as the etching gas for the absorber layer since the damage to the protective layer is small. On the other hand, in a case where a layer composed of an oxide or a layer composed of a oxynitride is employed as the low reflective layer, when a chlorine type gas is used, the etching rate is lower than when a fluorine gas is used. Thus, a fluorine gas is commonly used in the etching process of a low reflective layer.

In order to form a pattern in an absorber layer and a low reflective layer, it is usually required to carry out two-step etching process, i.e. to carry out an etching process using a fluorine type gas for the low reflective layer and to carry out an etching process using a chlorine type gas for the absorber layer. However, when such a two-step etching process is carried out, two etching chambers are required, and thus the process becomes complicated and there is concern about contamination during transfer between chambers. Further, in a case where two steps of the etching process are carried out in a chamber, different types of gases i.e. a fluorine type gas and a chlorine type gas are mixed, and thus problems may occur such as contamination of the chamber and destabilization of the process.

The present inventors conducted extensive studies to solve such problems and previously found that when the low reflective layer is a film (SiN film) containing Si and N, it has low reflective layer properties in the entire wavelength region (190 to 260 nm) of an inspection light for a mask pattern, and an improvement in the etching rate in an etching process employing a chlorine type gas is possible. An EUV mask blank based on this knowledge is disclosed in Patent Document 4.

However, the EUV mask blank disclosed in Patent Document 4 has a low reflective layer which is a film containing Si, and thus there is a concern that a problem about adhesion with a resist for a mask pattern as described in paragraph [0003] of Patent Document 5 may occur. Patent Document 5 includes a description about adhesion between a Si-containing film and a resist which is applied at the time of forming a pattern, and it discloses that in the case of a Si-containing film, the adhesion with a resist is insufficient. That is, in the case where the low reflective layer is a Si-containing film, the adhesion with a resist which is applied at the time of forming a mask pattern is insufficient, and when a fine resist pattern is formed, specifically, when a fine resist pattern having a width of about 100 nm or less, problems may occur such that a resist pattern disappears or a resist pattern falls down and becomes a defect of the resist pattern.

PRIOR ART DOCUMENTS

Patent Documents

Patent Document 1: JP 2004-6798 A
Patent Document 2: JP 2006-228767 A
Patent Document 3: JP 2007-335908 A
Patent Document 4: WO2009/154238
Patent Document 5: JP 2008-70799 A

DISCLOSURE OF INVENTION

Technical Problem

In order to solve the above problems, an object of the present invention is to provide an EUV mask blank provided with a low reflective layer, which has excellent properties as an EUV mask blank, particularly has low reflectance at the wavelength region of light for pattern inspection, has a sufficient etching rate in an etching process using a chlorine type gas, and has good adhesion with a resist, whereby it is possible to solve problems the such that a resist pattern disappears or a resist pattern falls down and becomes a defect of the resist pattern when a fine resist pattern having a width of about 100 nm or less is formed.

Further, another object of the present invention is to provide a process for producing such an EUV mask blank, a reflective mask for EUV lithography obtained by patterning the blank, and a process for producing a semiconductor integrated circuit using such a reflective mask.

Solution to Problem

The present inventors have conducted an extensive study to accomplish the above objects, and as a result, they have found that when the low reflective layer has a stacked structure wherein a film (SiN film) containing Si and N, and a film (TaN film) containing Ta and N or a film (TaON film) containing Ta, O and N are stacked, it is possible to solve the problems such that a resist pattern disappears or a resist pattern falls down and becomes a defect of the resist pattern when a fine resist pattern having a width of about 100 nm or less is formed since the low reflective layer has low reflective layer properties in the entire wavelength region (190 to 260 nm) of an inspection light for a mask pattern, is capable of improving etching rate in the etching process using a chlorine type gas, and has sufficient adhesion with a resist.

The present invention is accomplished based on the above knowledge, and it provides a reflective mask blank for EUV lithography (hereinafter also referred to as "the EUV mask blank (1) of the present invention") comprising a substrate, and a reflective layer for reflecting EUV light, an absorber layer for absorbing EUV light and a low reflective layer to an inspection light (wavelength: 190 to 260 nm) for a mask pattern, formed in this order on the substrate, wherein the low reflective layer has a stacked structure having a first layer containing at least 95 atomic % (hereinafter referred to as "at %") in total of silicon (Si) and nitrogen (N) and a second layer containing at least 95 at % in total of tantalum (Ta), oxygen (O) and nitrogen (N), stacked in this order from the absorber layer side.

Further, the present invention provides a reflective mask blank for EUV lithography (hereinafter also referred to as "the EUV mask blank (2) of the present invention") comprising a substrate, and a reflective layer for reflecting EUV light, an absorber layer for absorbing EUV light and a low reflective layer to an inspection light (wavelength: 190 to 260 nm) for a mask pattern, formed in this order on the substrate, wherein the low reflective layer has a stacked structure having a first layer containing at least 95 at % in total of silicon (Si) and nitrogen (N) and a second layer containing at least 95 at % in total of tantalum (Ta) and nitrogen (N), stacked in this order from the absorber layer side.

In the EUV mask blanks (1) and (2) of the present invention, it is preferred that in the first layer, the Si content is from 5 to 80 at %, and the N content is from 15 to 90 at %.

In the EUV mask blank (1) of the present invention, it is preferred that in the second layer, the Ta content is from 30 to 80 at %, the total content of O and N is from 20 to 70 at %, and the compositional ratio of O to N is from 9:1 to 1:9.

In the EUV mask blank (2) of the present invention, it is preferred that in the second layer, the Ta content is from 30 to 80 at %, and the N content is from 20 to 70 at %.

In the EUV mask blanks (1) and (2) of the present invention, it is preferred that the surface roughness (rms) of the surface of the second layer is at most 0.5 nm.

In the EUV mask blanks (1) and (2) of the present invention, it is preferred that the crystal structure of the first layer and the second layer is amorphous.

In the EUV mask blanks (1) and (2) of the present invention, it is preferred that the total thickness of the first layer and the second layer is from 3.5 to 23 nm.

In the EUV mask blanks (1) and (2) of the present invention, it is preferred that the thickness of the first layer is from 3 to 18 nm, and the thickness of the second layer is from 0.5 to 5 nm, provided that the difference between the thickness of the first layer and the thickness of the second layer (thickness of the first layer—thickness of the second layer) is at least 2 nm.

In the EUV mask blanks (1) and (2) of the present invention, it is preferred that the absorber layer is composed mainly of tantalum (Ta).

In the EUV mask blanks (1) and (2) of the present invention, the absorber layer is composed mainly of tantalum (Ta) and may contain at least one element selected from the group consisting of hafnium (Hf), silicon (Si), zirconium (Zr), germanium (Ge), boron (B), nitrogen (N) and hydrogen (H).

In the EUV mask blanks (1) and (2) of the present invention, it is preferred that the absorber layer contains less than 25 at % of oxygen (O).

In the EUV mask blanks (1) and (2) of the present invention, it is preferred that the total thickness of the absorber layer and the low reflective layer is from 40 to 200 nm.

In the EUV mask blanks (1) and (2) of the present invention, when a protective layer for protecting the reflective layer at the time of forming a pattern in the absorber layer is formed between the reflective layer and the absorber layer, it is preferred that the protective layer is formed from one member selected from Ru, a Ru compound, $SiO_2$ and CrN.

In the EUV mask blanks (1) and (2) of the present invention, it is preferred that the reflectance of the inspection light for a mask pattern having the wavelength (190 to 260 nm) is at most 15% at the surface of the low reflective layer.

In the EUV mask blank (1) of the present invention, it is preferred that the first layer is formed by carrying out a sputtering method using a Si target in an inert gas atmosphere containing nitrogen (N) or carrying out a sputtering method using a SiN target in an inert gas atmosphere, and the second layer is formed by carrying out a sputtering method using a Ta target in an inert gas atmosphere containing nitrogen (N) and oxygen (O).

In the EUV mask blank (2) of the present invention, it is preferred that the first layer is formed by carrying out a sputtering method using a Si target in an inert gas atmosphere containing nitrogen (N) or carrying out a sputtering method using a SiN target in an inert gas atmosphere, and the second layer is formed by carrying out a sputtering method using a Ta target in an inert gas atmosphere containing nitrogen (N).

Further, the present invention provides a process for producing an EUV mask blank, which comprises forming a reflective layer for reflecting EUV light, an absorber layer for absorbing EUV light, and a first layer and a second layer of a low reflective layer to an inspection light (wavelength: 190 to 260 nm) for a mask pattern, in this order on a substrate, wherein the first layer is formed by carrying out a sputtering method using a Si target in an inert gas atmosphere containing nitrogen (N) or carrying out a sputtering method using a SiN target in an inert gas atmosphere, and the second layer is formed by carrying out a sputtering method using a Ta target in an inert gas atmosphere containing nitrogen (N) and oxygen (O).

Further, the present invention provides a process for producing an EUV mask blank, which comprises forming a reflective layer for reflecting EUV light, an absorber layer for absorbing EUV light, and a first layer and a second layer of a low reflective layer to an inspection light (wavelength: 190 to 260 nm) for a mask pattern, in this order on a substrate, wherein the first layer is formed by carrying out a sputtering method using a Si target in an inert gas atmosphere containing nitrogen (N) or carrying out a sputtering method using a SiN target in an inert gas atmosphere, and the second layer is formed by carrying out a sputtering method using a Ta target in an inert gas atmosphere containing nitrogen (N).

Further, the present invention provides a reflective mask for EUV lithography (hereinafter referred to as "the EUV mask of the present invention"), which is obtained by subjecting to patterning the absorber layer and the low reflective layer of the above EUV mask blank (1) and (2) of the present invention.

Further, the present invention provides a process for producing a semiconductor integrated circuit, which comprises subjecting an object to be exposed to exposure by means of the above EUV mask.

Advantageous Effects of Invention

When the EUV mask blank of the present invention is used, a sufficient etching rate as compared with conventional low reflective layers may be obtained even in an etching process using a chlorine type gas. Thus, etching of a reflective layer and an absorber layer only by a chlorine type gas is possible, and it is expected that the etching process and the etching apparatus can be simplified, as well as it is expected that contamination during the etching process can be reduced. Further, according to the present invention, etching rate of the low reflective layer is higher than that of a conventional reflective layer, whereby it is possible to make a resist thinner than it already is, and as a result, it is expected that a finer patterning may become possible.

Further, in the EUV mask blank of the present invention, the low reflective layer has good adhesion with a resist, whereby it is possible to solve problems such that a resist pattern disappears or a resist pattern falls down and becomes a defect of the resist pattern when a fine resist pattern having a width of about 100 nm or less is formed.

Further, according to the process for producing an EUV mask blank of the present invention, an EUV mask blank excellent in various kinds of properties may easily be obtained, as described above.

DESCRIPTION OF EMBODIMENTS

Now, the EUV mask blank of the present invention will be described with reference to the drawings.

Figure 1:
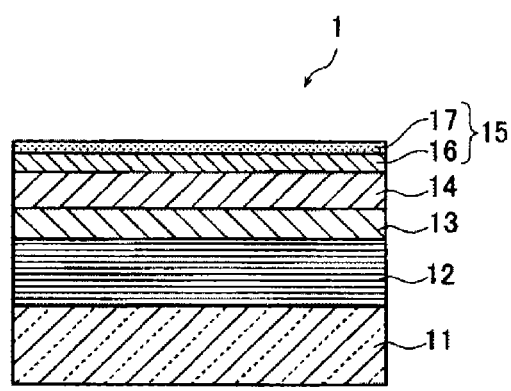
FIG. 1 is a schematic cross-sectional view illustrating an embodiment of the EUV reflective mask blank of the present invention.
Figure 2:
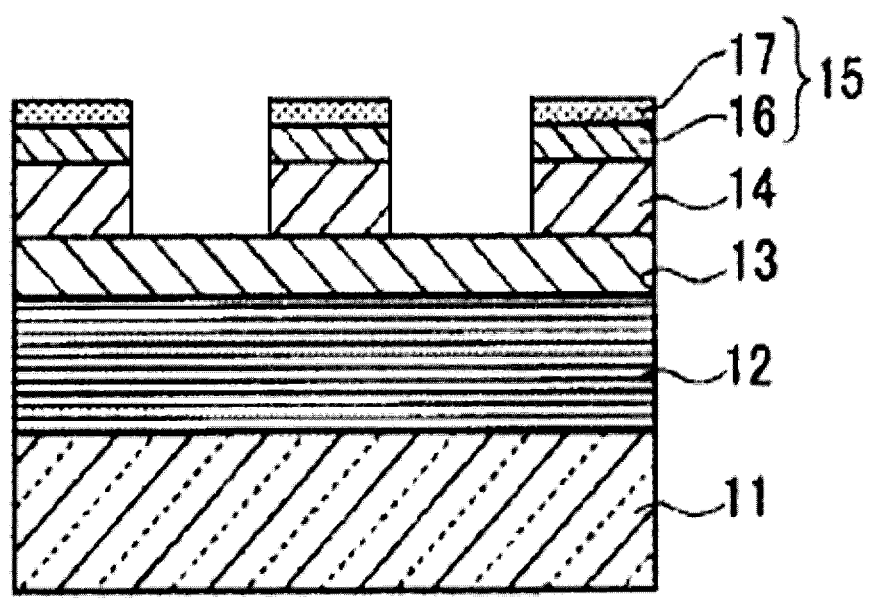
FIG. 2 is a schematic cross-sectional view illustrating an embodiment of the patterned EUV reflective mask blank of the present invention.

FIG. 1 is a schematic cross-sectional view illustrating an embodiment of the EUV mask blank of the present invention. A mask blank 1 shown in FIG. 1 has a reflective layer 12 to reflect EUV light and an absorber layer 14 to absorb EUV light formed in this order on a substrate 11. Between the reflective layer 12 and the absorber layer 14, a protective layer 13 to protect the reflective layer 12 at the time of pattern formation in the absorber layer 14 is formed. On the absorber layer 14, a low reflective layer 15 to an inspection light for a mask pattern is formed. The low reflective layer 15 has a stacked structure having a first layer 16 and a second layer 17 stacked in this order from the absorber layer 14 side.

In the construction shown in FIG. 1 of the EUV mask blank 1 of the present invention, only the substrate 11, the reflective layer 12, the absorber layer 14, and the low reflective layer 15 having a stacked structure of the first layer 16 and the second layer 17 are essential, and the protective layer 13 is an optional constituting element.

Now, the respective constituting elements of the EUV mask blank 1 will be described.

The substrate 11 is required to satisfy the properties as a substrate for an EUV mask blank. Therefore, it is preferred that the substrate 11 has a low thermal expansion coefficient. Specifically, the thermal expansion coefficient of the substrate 11 is preferably $0\pm0.05\times10^{-7}/°$ C., particularly preferably $0\pm0.03\times10^{-7}/°$ C., at 20° C. Further, the substrate 11 is preferably one excellent in smoothness, planarity and durability against a cleaning liquid to be used for e.g. cleaning of an EUV mask blank or a photomask after forming a pattern. As the substrate 11, specifically, glass having a low thermal expansion coefficient, e.g. $SiO_2$—$TiO_2$ type glass, may be used. However, the substrate is not limited thereto, and it is possible to employ a substrate of e.g. crystallized glass having β-quartz solid solution precipitated, quartz glass, silicon or metal.

The substrate 11 preferably has a smooth surface having a surface roughness (rms) of at most 0.15 nm and a planarity of at most 100 nm, whereby a high reflectance and transfer precision can be attained by a photomask after forming a pattern.

The size, thickness, etc. of the substrate 11 are suitably determined depending upon e.g. the designed values for the mask. In Examples given hereinafter, a $SiO_2$—$TiO_2$ type glass having a size of 6 inch (152 mm) square and a thickness of 0.25 inch (6.3 mm) was used.

It is preferred that no defect is present on the surface of the substrate 11 on the side where the reflective layer 12 is to be formed. However, even in a case where a defect is present, in order not to cause a phase defect due to a concave defect and/or a convex defect, it is preferred that the depth of a concave defect or the height of a convex defect is not more than 2 nm, and the half value width of such a concave defect or convex defect is not more than 60 nm.

The reflective layer 12 is not particularly limited as long as it has properties desired as a reflective layer of an EUV mask blank. The property particularly required for the reflective layer 12 of the EUV mask blank is a high EUV light reflectance. Specifically, when light ray within an EUV wavelength region is applied at an incident angle of 6° to the surface of the reflective layer 12, the maximum value of the reflectance of the light ray in the vicinity of a wavelength of 13.5 nm is preferably at least 60%, more preferably at least 65%. Further, even in a case where an protective layer 13 or a low reflective layer 15 is formed on the reflective layer 12, the maximum value of the reflectance of light ray in the vicinity of a wavelength of 13.5 nm is preferably at least 60%, more preferably at least 65%.

As the reflective layer 12, a multilayer reflective film having a high refractive index layer and a low refractive index layer alternately stacked plural times is usually used, since a high EUV light reflectance can thereby be accomplished. In the multilayer reflective film constituting the reflective layer 12, Mo is widely used for the low refractive index layer, and Si is widely used for the high refractive index layer. That is, a Mo/Si multilayer reflective film is most common. However, the multilayer reflective film is not limited thereto, and a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film and a Si/Ru/Mo/Ru multilayer reflective film may also be used.

The thickness of each layer constituting the multilayer reflective film constituting the reflective layer 12 and the number of repeating units of the layers may suitably be selected depending upon the film material to be used and the EUV light reflectance required for the reflective layer. Taking the Mo/Si multilayer reflective film as an example, in order to obtain a reflective layer 12 having the maximum value of the EUV light reflectance being at least 60%, a Mo layer having a thickness of 2.3±0.1 nm and a Si layer having a thickness of 4.5±0.1 nm may be stacked repeatedly so that the number of repeating units becomes from 30 to 60, to obtain a multilayer reflective film. In such a multilayer reflective film having repeating units of a Mo layer and a Si layer, it is preferred that the uppermost layer of the multilayer reflective film is made to be a Si film.

Here, each layer constituting the multilayer reflective film constituting the reflective layer 12 may be formed to have a desired thickness by means of a well-known film-forming method such as a magnetron sputtering method or an ion beam sputtering method. For example, in the case of forming a Mo/Si multilayer reflective film by means of an ion beam sputtering method, it is preferred that a Si layer is formed to have a thickness of 4.5 nm at an ion accelerating voltage of from 300 to 1,500 V and a film-deposition rate of from 0.03 to 0.3 nm/sec by using a Si target as the target and an Ar gas (gas pressure: $1.3 \times 10^{-2}$ Pa to $2.7 \times 10^{-2}$ Pa) as the sputtering gas, and then a Mo layer is formed to have a thickness of 2.3 nm at an ion accelerating voltage of from 300 to 1,500 V and a film-deposition rate of from 0.03 to 0.3 nm/sec by using a Mo target as the target and an Ar gas (gas pressure: $1.3 \times 10^{-2}$ Pa to $2.7 \times 10^{-2}$ Pa) as the sputtering gas. When this operation is taken as one cycle, the Mo/Si multilayer reflective film is formed by 40 to 50 cycles of such stacking of the Si layer and the Mo layer.

In order to prevent oxidation of the surface of the reflective layer 12, the uppermost layer of the reflective multilayer film constituting the reflective layer 12 is preferably a layer made of a hardly oxidizable material. The layer made of a hardly oxidizable material will function as a cap layer of the reflective layer 12. As a specific example of the layer made of a hardly oxidizable material functioning as the cap layer, a Si layer may, for example, be mentioned. In a case where the multilayer reflective film constituting the reflective layer 12 is a Mo/Si film, the uppermost layer may be made to be a Si layer, so that the uppermost layer will function as a cap layer. In such a case, the thickness of the cap layer is preferably from 9 to 13 nm.

The protective layer 13 is provided for the purpose of protecting the reflective layer 12, so that the reflective layer 12 will not be damaged by an etching process at the time of forming a pattern in the absorber layer 14 by an etching process, usually by a dry etching process. Accordingly, as the material for the protective layer 13, a material is selected which is hardly susceptible to an influence by the etching process of the absorber layer 14, i.e. a material having an etching rate lower than the absorber layer 14 and yet hardly susceptible to a damage by such an etching process. A material which satisfies such conditions, may, for example, be Cr, Al, Ta or their nitrides, Ru or a Ru compound (such as RuB or RuSi) as well as $SiO_2$, $Si_3N_4$, $Al_2O_3$ or a mixture thereof. Among them, Ru or a Ru compound (such as RuB or RuSi), CrN or $SiO_2$ is preferred, and Ru or a Ru compound (such as RuB or RuSi) is particularly preferred.

The thickness of the protective layer 13 is preferably from 1 to 60 nm.

The protective layer 13 is formed by using a well-known film deposition method such as magnetron sputtering or ion beam sputtering. In a case where a Ru film is formed by magnetron sputtering, it is preferred to carry out film deposition at an applied power of from 30 to 1,500 V at a film deposition rate of from 0.02 to 1 nm/sec so that the thickness will be from 2 to 5 nm by using a Ru target as the target and using an Ar gas (gas pressure: $1 \times 10^{-2}$ Pa to $10 \times 10^{-1}$ Pa) as the sputtering gas.

The characteristic particularly required for the absorber layer 14 is a very low EUV light reflectance. Specifically, when the surface of the absorber layer 14 is irradiated with light in a wavelength region of EUV light, the maximum light reflectance in the vicinity of a wavelength of 13.5 nm is preferably at most 5%, particularly preferably at most 3%, further preferably at most 1%.

In the EUV mask blank 1 of the present invention, also when the surface of the low reflective layer 15 is irradiated with light in a wavelength region of EUV light, the maximum light reflectance in the vicinity of a wavelength of 13.5 nm is preferably at most 5%, particularly preferably at most 3%, further preferably at most 1%.

In order to attain the above characteristics, the absorber layer 14 is made of a material having a high absorption coefficient of EUV light. As a material having a high absorption coefficient of EUV light, a material containing tantalum (Ta) as the main component is preferably used. In this specification, "a material containing tantalum (Ta) as the main component" means a material containing Ta in an amount of at least 40 at %, preferably at least 50 at %, more preferably at least 55 at % in the material.

The material containing Ta as the main component to be used for the absorber layer 14 may contain, in addition to Ta, at least one element selected from hafnium (Hf), silicon (Si), zirconium (Zr), germanium (Ge), boron (B) and nitrogen (N). Specifically, the material containing the above element in addition to Ta may, for example, be TaN, TaHf, TaHfN, TaBSi, TaBSiN, TaB, TaBN, TaSi, TaSiN, TaGe, TaGeN, TaZr or TaZrN.

However, the absorber layer 14 preferably contains no oxygen (O). Specifically, the O content in the absorber layer 14 is preferably less than 25 at %. At the time of forming a pattern in the absorber layer 14, a dry etching process is usually employed, and as the etching gas, a chlorine type gas or a fluorine type gas is usually used. In a case where a film containing Ru or a Ru compound is formed as a protective layer on the reflective layer for the purpose of preventing the reflective layer from being damaged by the etching process, a chlorine type gas is mainly used as the etching gas in view of small damage to the protective layer. However, in the case of carrying out the drying etching process using a chlorine type gas, if the absorber layer 14 contains oxygen, the etching rate will be decreased, and the resist damage will be increased, such being unfavorable. The content of oxygen in the absorber layer 14 is preferably at most 15 at %, more preferably at most 10 at %, further preferably at most 5 at %, and it is particularly preferred that the absorber layer 14 contains substantially no oxygen other than inevitable impurities.

It is preferred to set the thickness of the absorber layer 14 so that the total thickness of the absorber layer 14 and the low reflective layer 15 is from 40 to 200 nm, more preferably from 50 to 200 nm, further preferably from 50 to 150 nm, particularly preferably from 50 to 100 nm.

The absorber layer 14 having the above construction can be formed by a known film forming method, for example, a magnetron sputtering method or an ion bean sputtering method.

For example, in a case where a TaHf film as the absorber layer 14 is formed by employing a magnetron sputtering method, it may be formed under the following conditions.

Sputtering target: TaHf compound target (Ta=30 to 70 at %, Hf=70 to 30 at %)
Sputtering gas: Inert gas such as Ar gas (gas pressure: $1\times10^{-1}$ Pa to $50\times10^{-1}$ Pa, preferably $1\times10^{-1}$ Pa to $40\times10^{-1}$ Pa, more preferably $1\times10^{-1}$ Pa to $30\times10^{-1}$ Pa)
Degree of vacuum before film deposition: at most $1\times10^{-4}$ Pa, preferably at most $1\times10^{-5}$ Pa, more preferably at most $10^{-6}$ Pa
Applied power: 30 to 1,000 W, preferably 50 to 750 W, more preferably 80 to 500 W
Film deposition rate: 2 to 60 nm/min, preferably 3.5 to 45 nm/min, more preferably 5 to 30 nm/min Further, in a case where a TaN layer as the absorber layer 14 is formed by employing a magnetron sputtering method, it may be formed under the following conditions.

Sputtering target: Ta target
Sputtering gas: $N_2$ gas diluted with an inert gas such as Ar gas (gas pressure: $1\times10^{-1}$ Pa to $50\times10^{-1}$ Pa, preferably $1\times10^{-1}$ Pa to $40\times10^{-1}$ Pa, more preferably $1\times10^{-1}$ Pa to $30\times10^{-1}$ Pa)
Degree of vacuum before film deposition: at most $1\times10^{-4}$ Pa, preferably at most $1\times10^{-5}$ Pa, more preferably at most $10^{-6}$ Pa
Applied power: 30 to 1,000 W, preferably 50 to 750 W, more preferably 80 to 500 W
Film deposition rate: 2 to 60 nm/min, preferably 3.5 to 45 nm/min, more preferably 5 to 30 nm/min The low reflective layer 15 is constituted by a film which shows low reflection properties to the wavelength of an inspection light to be used for inspection of a mask pattern. In the preparation of an EUV mask, after forming a pattern in the absorber layer, inspection is carried out to ascertain whether the pattern is formed as designed. In such an inspection of a mask pattern, an inspection machine is used wherein light of about 257 nm is used as an inspection light at present. However, as the pattern width becomes smaller, the wavelength used for the inspection light becomes shorter, and use of light at a wavelength of from 190 to 199 nm in future is predicted. Therefore, light having a wavelength of from 190 to 260 nm is required for the inspection light. That is, inspection is carried out by the difference in the reflectance to an inspection light having such a wavelength, specifically, by the difference in the reflectance between a surface where the absorber layer 14 is removed and exposed by forming a pattern, and the surface of the absorber layer 14 which was not removed by forming a pattern and remains, that is, the contrast of reflected light on such surfaces. Here, the former is the surface of the reflective layer 12. However, in a case where the protective layer 13 is formed on the reflective layer 12, it is the surface of the protective layer 13. Accordingly, if the difference in the reflectance to the wavelength of an inspection light between the surface of the reflective layer 12 or the surface of the protective layer 13 and the surface of the absorber layer 14 is small, the contrast at the time of inspection will be poor, and no accurate inspection can be carried out.

The absorber layer 14 having the above constitution has a very low EUV light reflectance and has excellent characteristics as an absorber layer of the EUV mask blank 1. However, in terms of the wavelength of an inspection light, it does not necessarily has a sufficiently low light reflectance. As a result, the difference between the reflectance of the surface of the absorber layer 14 and the reflectance of the surface of the protective layer 13 to the wavelength of an inspection light tends to be small, and sufficient contrast at the time of inspection may not be obtained. If no sufficient contrast at the time of inspection is obtained, pattern defects cannot sufficiently be detected in the inspection of a mask pattern, and no accurate defect inspection can be carried out.

In the EUV mask blank 1 of the present invention, a low reflective layer 15 to an inspection light for a mask pattern is formed on the absorber layer 14, whereby the contrast at the time of inspection will be good. In the case of the EUV mask blank 1 of the present invention, the contrast of reflected light is a difference in the reflectance between the surface of the reflective layer 12 and the surface of the low reflective layer 15 to the wavelength of an inspection light. However, in a case where the protective layer 13 is formed on the reflective layer 12, it is the difference in the reflectance between the surface of the protective layer 13 and the surface of the low reflective layer 15.

In the EUV mask blank 1 of the present invention, by forming the low reflective layer 15 on the absorber layer 14, the light reflectance is very low in the entire wavelength region (190 to 260 nm) of an inspection light for a mask pattern. Specifically, when the surface of the low reflective layer 15 is irradiated with light in a wavelength region (190 to 260 nm) of an inspection light for a mask pattern, the light reflectance (the maximum light reflectance) of the surface of the low reflective layer 15 is preferably at most 15%, more preferably at most 10%, further preferably at most 5%, in the entire wavelength region (190 to 260 nm) of an inspection light.

When the light reflectance of the surface of the low reflective layer 15 is at most 15% in the entire wavelength region (190 to 260 nm) of an inspection light for a mask pattern, the contrast at the time of inspection is good regardless of the wavelength of an inspection light for a mask pattern.

To achieve the above characteristics, it is preferred that the low reflective layer 15 is composed of a material having a higher refractive index in the wavelength region of an inspection light for a mask pattern than the absorber layer 14 and that its crystal state is amorphous. In addition, the low reflective layer 15 preferably has a sufficient etching rate in an etching process employing a chlorine type gas.

In order to fulfill the above-described requirements for the low reflective layer 15, the EUV mask blank of the present invention has the low reflective layer 15 having a stacked structure having a first layer 16 and a second layer 17 stacked in this order from the absorber layer 14 side, wherein the first layer 16 of the low reflective layer 15 does not have a composition containing oxygen such as an oxide or an oxynitride which a low reflective layer of a conventional mask blank has but has a composition containing at least 95 at %, further containing at least 98 at % in total of Si and N. It is thereby possible to obtain a sufficiently low light reflectance in the wavelength region of an inspection light for a mask pattern and to obtain a good contrast at the time of inspection.

Further, when the first layer 16 of the low reflective layer 15 has a composition containing no oxygen, the low reflective layer 15 having a stacked structure has a sufficient etching rate in the etching process employing a chlorine type gas.

Hereinafter in this specification, the above-described first layer containing at least 95 at % in total of Si and N will also be referred to as "the first layer (SiN layer)" or simply as "SiN layer".

Here, as the index to the sufficient etching rate of the low reflective layer 15 having a stacked structure in the etching process employing a chlorine type gas, the etching selectivity to the reflective layer (or usually the protective layer since it is usually formed on the reflective layer) may be employed. The etching selectivity to the reflective layer (or the protective layer) is employed as an index to show a sufficient etching rate of the absorber layer in relation to the reflective layer (or the protective layer). By applying it to the low reflective layer having a stacked structure, it is possible to judge whether the low reflective layer having a stacked structure has a sufficient etching rate.

In this specification, the etching selectivity can be calculated from the following formula:

Etching selectivity=(etching rate of low reflective layer (or absorber layer))/(etching rate of reflective layer (or protective layer))

In the case of the absorber layer, the etching selectivity obtained by the above formula is considered to be preferably at least 10, more preferably at least 11, further preferably at least 12. Accordingly, when the etching selectivity of the low reflective layer obtained from the above formula is within the above range, the low reflective layer is considered to have a sufficient etching rate in the etching process employing a chlorine type gas.

The first layer 16 of the low reflective layer 15 having a stacked structure preferably has a Si content of from 5 to 80 at %, and preferably has a N content of from 15 to 90 at %. If the Si content is less than 5 at %, the electrical conductivity of the first layer 16 tends to be low, thus leading to a problem of charge up at the time of electron beam drawing on the low reflective layer 15. If the Si content exceeds 80 at %, the light reflectance of the low reflective layer 15 having a stacked structure in the wavelength region of an inspection light for a mask pattern may not sufficiently be low, and the light reflectance at the surface of the low reflective layer may not be 15% or less. Further, if the N content is lower than 15 at %, the light reflectance of the low reflective layer 15 having a stacked structure in the wavelength region of an inspection light for a mask pattern may not sufficiently be low, and the light reflectance at the surface of the low reflective layer 15 may not be 15% or less. If the N content is higher than 90 at %, the acid resistance of the low reflective layer 15 will be decreased, and the insulating property of the first layer 16 will be increased, thus leading to a problem such as charge up at the time of electron beam drawing on the low reflective layer 15 having a stacked structure.

The Si content in the first layer 16 of the low reflective layer 15 having a stacked structure is more preferably from 10 to 80 at %, further preferably from 20 to 80 at %, particularly preferably from 30 to 70 at %. Further, the N content is more preferably from 15 to 85 at %, further preferably from 15 to 75 at %, particularly preferably from 25 to 65 at %.

As is evident from the above description, the first layer 16 of the low reflective layer 15 having a stacked structure preferably contains no oxygen (O). Specifically, the oxygen (O) content in the first layer 16 is preferably less than 5 at %. As described above for the absorber layer 14, in a dry etching process employing a chlorine type gas for the purpose of forming a pattern in the absorber layer 14 and the low reflective layer 15 on the absorber layer 14, if the first layer 16 of the low reflective layer 15 having a stacked structure contains oxygen, the etching rate will be decreased, whereby the resist tends to be significantly damaged, such being unfavorable.

The oxygen content in the first layer 16 of the absorber layer 15 having a stacked structure is more preferably at most 4 at %, further preferably at most 3 at %, and it is particularly preferred that the first layer 16 contains substantially no oxygen other than inevitable impurities.

As described above, the layer used as the first layer 16 of the low reflective layer 15 having a stacked structure, which contains at least 95 at % in total of Si and N, has excellent characteristics as a low reflective layer of an EUV mask blank. However, since the layer contains Si as an element constituting the layer, the adhesion with a resist to be applied at the time of forming a mask pattern is not sufficient, and if the low reflective layer 15 is formed only from the first layer 16, when a fine resist pattern having a width of about 100 nm or less is formed, problems may occur such that a resist pattern disappears or a resist pattern falls down and becomes a defect of the resist pattern.

The EUV mask blank of the present invention has a low reflective layer 15 having a stacked structure wherein a second layer 17 having excellent adhesion with a resist to be applied at the time of forming a mask pattern is stacked on the first layer 16. The above problems, that is, problems such that when a fine resist pattern having a width of about 100 nm or less is formed, a resist pattern disappears or a resist pattern falls down (i.e. an edge portion of a resist layer formed into a prescribed pattern collapses) and becomes a defect of the resist pattern, are thereby solved.

The second layer 17 formed for the above purpose is preferably excellent in adhesion with a resist to be applied at the time of forming a mask pattern as well as composed of a material having a higher refractive index in the wavelength region of an inspection light for a mask pattern than the absorber layer 14 since it constitutes a part of the low reflective layer 15 having a stacked structure. Further, the crystal state of the second layer 17 is preferably amorphous.

In the EUV mask blank (1) of the present invention, the above characteristics may be attained also because the second layer 17 of the low reflective layer 15 having a stacked structure contains at least 95 at % in total of tantalum (Ta), oxygen (O) and nitrogen (N).

Hereinafter in this specification, the above second layer containing at least 95 at % in total of tantalum (Ta), oxygen (O) and nitrogen (N) will also be referred to as "the second layer (TaON layer)" or simply as "TaON layer".

The second layer (TaON layer) 17 of the low reflective layer 15 having a stacked structure preferably contains these elements in a specific proportion as described below.

The second layer (TaON layer) 17 of the low reflective layer 15 having a stacked structure is preferably such that Ta content is from 30 to 80 at %, the total content of O and N is from 20 to 70 at %, and the compositional ratio of O to N is from 9:1 to 1:9. If the content of O and N is less than 20 at %, the light reflectance in the wavelength region of an inspection light for a mask pattern cannot be decreased at the low reflective layer 15 having a stacked structure, and the light reflectance at the surface of the low reflective layer 15 may not be at most 15%. Further, the crystal state of the second layer (TaON layer) 17 may not become amorphous, and the surface roughness (rms) of the second layer (TaON layer) 17 constituting the surface of the low reflective layer 15 having a stacked structure may not become at most 0.5 nm.

On the other hand, if the content of O and N is larger than 70 at %, the insulating property of the second layer (TaON layer) 17 may be increased, and thus problems may occur such as charge up at the time of electron beam drawing on the low reflective layer 15 having a stacked structure.

The Ta content of the second layer (TaON layer) 17 of the low reflective layer 15 having a stacked structure is more preferably from 35 to 75 at %, further preferably from 40 to 70 at %. The total content of O and N is more preferably from 25 to 65 at %, further preferably from 30 to 60 at %. Further, the compositional ratio of O to N is more preferably from 8:2 to 2:8, further preferably from 7:3 to 3:7.

As described above, the total thickness of the absorber layer 14 and the low reflective layer 15 having a stacked structure is preferably from 40 to 200 nm, more preferably from 50 to 200 nm, further preferably from 50 to 150 nm, particularly preferably from 50 to 100 nm. However, if the thickness of the low reflective layer 15 having a stacked structure is more than the thickness of the absorber layer 14, the EUV light absorption properties of the absorber layer 14 may be decreased, and accordingly the thickness of the low reflective layer 15 having a stacked structure is preferably smaller than the thickness of the absorber layer. Accordingly, the thickness of the low reflective layer 15 having a stacked structure i.e. the total thickness of the first layer 16 and the second layer 17 is preferably from 3.5 to 23 nm, more preferably from 8 to 17 nm.

In the EUV mask blank of the present invention, the first layer 16 and the second layer 17 constituting the low reflective layer 15 having a stacked structure preferably have thicknesses within ranges as described below.

In the low reflective layer 15 having a stacked structure, it is preferred that the thickness of the first layer 16 is from 3 to 18 nm, the thickness of the second layer is from 0.5 to 5 nm, the thickness of the first layer 16 is larger than the thickness of the second layer 17, and the difference between the thickness of the first layer and the thickness of the second layer (thickness of the first layer—thickness of the second layer) is at least 2 nm.

If the thickness of the first layer 16 is less than 3 nm, in the low reflective layer 15 having a stacked structure, the light reflectance in the wavelength region of an inspection light for a mask pattern may not be sufficiently decreased, and the light reflectance at the surface of the low reflective layer 15 may not become at most 15%. On the other hand, if the thickness of the first layer 16 is more than 18 nm, again in the low reflective layer 15 having a stacked structure, the light reflectance in the wavelength region of an inspection light for a mask pattern may not be sufficiently decreased, and the light reflectance at the surface of the low reflective layer 15 may not become at most 15%.

If the thickness of the second layer 17 is less than 0.5 nm, the second layer may not become a continuous film, and the adhesion with a resist may not become uniform. On the other hand, if the thickness of the second layer 17 is more than 5 nm, in the low reflective layer 15 having a stacked structure, the light reflectance in the wavelength region of an inspection light for a mask pattern may not be decreased sufficiently, and the light reflectance at the surface of the low reflective layer 15 may not become at most 15%.

If the difference in thickness between the first layer and the second layer is less than 2 nm, the proportion of the first layer in the low reflective layer 15 having a stacked structure will be small, and thus when an etching process using a chlorine type gas is carried out, the etching rate of the low reflective layer 15 having a stacked structure may be low.

In the low reflective layer 15 having a stacked structure, the thickness of the first layer 16 is more preferably from 8 to 17 nm, further preferably from 9 to 14 nm. The thickness of the second layer 17 is more preferably from 0.5 to 4 nm, further preferably from 0.5 to 3 nm. The difference in thickness between the first layer and the second layer is more preferably at least 4 nm, further preferably at least 6 nm.

As is evident from the above description, in the low reflective layer 15 having a stacked structure, the thickness of the second layer 17 is smaller than the thickness of the first layer 16, and among the functions required for the low reflective layer 15, the low light reflectance to an inspection light for a mask pattern in the wavelength region (190 to 260 nm) can be attained by the first layer 16. Further, among the functions required for the low reflective layer 15, the sufficient etching rate in an etching process using a chlorine type gas can be attained by the first layer 16 having the above-described composition and the second layer having a sufficiently thin thickness.

Thus, the second layer 17 of the low reflective layer 15 having a stacked structure may be formed also from a material excellent in adhesion with a resist to be applied at the time of forming a mask pattern among the materials used for the absorber layer 14.

From such a point of view, for the EUV mask blank (2) of the present invention, as the second layer 17 of the low reflective layer 15 having a stacked structure to be selected, a layer containing at least 95 at % in total of tantalum (Ta) and nitrogen (N) may be mentioned.

Hereinafter in this specification, the above second layer containing at least 95 at % in total of tantalum (Ta) and nitrogen (N) will also be referred to as "the second layer (TaN layer)" or simply as "TaN layer".

The second layer (TaN layer) 17 of the low reflective layer 15 having a stacked structure preferably contains these elements in a specific proportion as described below.

The second layer (TaN layer) 17 of the low reflective layer 15 having a stacked structure is preferably such that the Ta content is from 30 to 80 at %, and the N content is from 20 to 70 at %. If the N content is less than 20 at %, the crystal state of the second layer (TaN layer) 17 may not become amorphous, and the surface roughness (rms) of the second layer (TaN layer) 17 constituting the surface of the low reflective layer 15 having a stacked structure may not become at most 0.5 nm.

If the N content is more than 70 at %, the insulating property of the second layer (TaN layer) 17 will be increased, and problems may occur such as charge up at the time of electron beam drawing on the low reflective layer 15 having a stacked structure.

In the second layer (TaN layer) 17 of the low reflective layer 15 having a stacked structure, the Ta content is more preferably from 35 to 75 at %, further preferably from 40 to 70 at %, and the N content is more preferably from 25 to 65 at %, further preferably from 30 to 60 at %.

In the EUV mask blank (2) of the present invention, also in a case where the second layer of the low reflective layer 15 having a stacked structure is a TaN layer, it is preferred that the thickness of the first layer 16, the thickness of the second layer 17 and the difference in thickness between the first layer 16 and the second layer 17 fulfill the above conditions. Further, it is preferred that the thickness of the low reflective layer 15 having a stacked structure and the total thickness of the absorber layer 14 and the low reflective layer 15 having a stacked structure fulfill the above conditions.

The respective layers constituting the low reflective layer 15 having a stacked structure i.e. the first layer 16 and the second layer 17 (TaON layer or TaN layer) may contain from 0.1 to 5 at % of B from the target used for film formation.

The respective layers constituting the low reflective layer 15 having a stacked structure i.e. the first layer 16 and the second layer 17 (TaON layer or TaN layer) have the above-described constructions, whereby their crystal state is preferably amorphous.

In this specification, "the crystal state is amorphous" means that one has an amorphous structure and having no crystal structure at all or that one has a microcrystal structure.

Each of the respective layers constituting the low reflective layer 15 having a stacked structure i.e. the first layer 16 and the second layer 17 (TaON layer or TaN layer) is preferably a film having an amorphous structure or a film having a microcrystal structure. When they have such structures, it becomes easy to obtain a smooth surface of the low reflective layer 15, i.e. to obtain the surface of the second layer 17 having a surface roughness (rms) of at most 0.5 nm. The surface roughness (rms) of the surface of the second layer 17 can be measured by using an atomic force microscope. If the surface roughness of the surface of the second layer 17 constituting the surface of the low reflective layer 15 having a stacked structure is large, the edge roughness of the pattern to be formed in the low reflective layer 15 tends to be large, whereby the dimensional precision of the pattern deteriorates. As the pattern becomes fine, the influence of the edge roughness tends to be distinct, and accordingly the surface of the second layer 17 constituting the surface of the low reflective layer 15 having a stacked structure is required to be smooth.

"The surface roughness rms is at most 0.5 nm" means that the root-mean-square surface roughness is at most 0.5 nm.

When the surface roughness (rms) of the surface of the second layer 17 constituting the surface of the low reflective layer 15 having a stacked structure is at most 0.5 nm, the surface of the low reflective layer 15 is sufficiently smooth, and thus the dimensional precision of the pattern will not be deteriorated due to the influence of the edge roughness. The surface roughness (rms) of the surface of the second layer 17 is more preferably at most 0.4 nm, further preferably at most 0.3 nm.

Whether the crystal state of the respective layers constituting the low reflective layer 15 having a stacked structure i.e. the first layer 16 and the second layer 17 (TaON layer or TaN layer) is amorphous, i.e. the respective layers have an amorphous structure or a microcrystal structure may be determined by a X-ray diffraction (XRD) method. When the crystal state of the first layer 16 and the second layer 17 (TaON layer or TaN layer) is an amorphous structure or a microcrystal structure, no sharp peak will be observed among the diffraction peaks obtained by the XRD measurement.

The respective layers constituting the low reflective layer 15 having a stacked structure i.e. the first layer 16 and the second layer 17 (TaON layer or TaN layer) can be formed by the following steps.

The first layer 16 having the above-described construction i.e. the layer containing at least 95 at % in total of Si and N can be formed by carrying out a sputtering method employing a Si target or a SiN target, such as a magnetron sputtering method or an ion beam sputtering method.

The first layer 16 having the above-described construction can be formed by letting a Si target discharge in an atmosphere of a nitrogen ($N_2$) gas diluted with an inert gas such as argon (Ar). Or, it can be formed by letting a SiN target discharge in an atmosphere of an inert gas such as argon (Ar).

The Si target or the SiN target may contain from 0.1 to 10 at % of B.

In order to form the first layer 16 of the low reflective layer 15 having a stacked structure on the absorber layer 14 by employing the method using a Si target among the above methods, the method can be carried out specifically under the following film forming conditions.

(Film Forming Conditions for the First Layer 16 (SiN Film))

Sputtering gas: mixed gas of Ar and $N_2$ (Ar gas concentration: 3 to 80 vol %, preferably 5 to 70 vol %, more preferably 10 to 60 vol %; $N_2$ gas concentration: 3 to 80 vol %, preferably 5 to 70 vol %, more preferably 10 to 60 vol %; gas pressure: preferably $1\times10^{-2}$ Pa to $40\times10^{-1}$ Pa, more preferably $1\times10^{-1}$ Pa to $30\times10^{-1}$ Pa)

Applied power: 30 to 1,000 W, preferably 50 to 750 W, more preferably 80 to 500 W Film forming rate: 0.1 to 60 nm/min, preferably 0.5 to 45 nm/min, more preferably 1 to 30 nm/min In a case where an inert gas other than Ar is used, it is preferred that the concentration of the inert gas is set to be within the same concentration range as the above Ar gas concentration.

Further, in a case where a SiN target is employed, film formation may be carried out under a condition such that as the sputtering gas, a gas having a concentration of 100 vol % of an inert gas such as Ar is used, and the gas pressure, the applied power and the film forming rate are the same as above.

The second layer (TaON layer) 17 having the above-described construction i.e. the layer containing at least 95 at % in total of Ta, O and N can be formed by a sputtering method employing a Ta target, such as a magnetron sputtering method or an ion beam sputtering method, in an atmosphere of oxygen ($O_2$) and nitrogen ($N_2$) diluted with an inert gas containing at least one member selected from helium (He) argon (Ar), neon (Ne), krypton (Kr) and xenon (Xe).

Or, a TaN layer may be formed by the steps described below, followed by oxidizing the formed TaN layer by e.g.

exposing it to oxygen plasma or irradiating it with an ion beam using oxygen, to obtain the second layer (TaON layer).

In order to form the second layer (TaON layer) 17 on the first layer 16 by the above method, specifically the following film forming conditions may be employed.

(Film Forming Conditions for the Second Layer 17 (TaON Layer))

Sputtering gas: mixed gas of Ar, $O_2$ and $N_2$ ($O_2$ gas concentration: 5 to 80 vol %, preferably 6 to 70 vol %, more preferably 10 to 30 vol %; $N_2$ gas concentration: 5 to 75 vol %, preferably 6 to 35 vol %, more preferably 10 to 30 vol %; Ar gas concentration: 5 to 90 vol %, preferably 10 to 88 vol %, more preferably 20 to 80 vol %; gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Applied power: 30 to 1,000 W, preferably 50 to 750 W, more preferably 80 to 500 W Film forming rate: 0.01 to 60 nm/min, preferably 0.05 to 45 nm/min, more preferably 0.1 to 30 nm/min In a case where an inert gas other than Ar is used, it is preferred that the concentration of the inert gas is set to be within the same concentration range as the above Ar gas concentration. Further, in a case where plural types of inert gases are used, it is preferred that the total concentration of the inert gases is set to be within the same concentration range as the above Ar gas concentration.

The second layer (TaN layer) 17 having the above-described construction i.e. the layer containing at least 95 at % in total of Ta and N can be formed by a sputtering method employing a Ta target, such as a magnetron sputtering method or an ion beam sputtering method, in an atmosphere of nitrogen ($N_2$) diluted with an inert gas containing at least one member selected from helium (He) argon (Ar), neon (Ne), krypton (Kr) and xenon (Xe).

In order to form the second layer (TaN layer) 17 on the first layer 16 by the above method, specifically the following film forming conditions may be employed.

(Film Forming Conditions for the Second Layer 17 (TaN Layer))

Sputtering gas: mixed gas of Ar and $N_2$ (Ar gas concentration: 3 to 80 vol %, preferably 5 to 70 vol %, more preferably 10 to 60 vol %; $N_2$ gas concentration: 3 to 80 vol %, preferably 5 to 70 vol %, more preferably 10 to 60 vol %; gas pressure: preferably $1 \times 10^{-2}$ Pa to $40 \times 10^{-1}$ Pa, more preferably $1 \times 10^{-1}$ Pa to $30 \times 10^{-1}$ Pa)

Applied power: 30 to 1,000 W, preferably 50 to 750 W, more preferably 80 to 500 W Film forming rate: 0.01 to 60 nm/min, preferably 0.05 to 45 nm/min, more preferably 0.1 to 30 nm/min In a case where an inert gas other than Ar is used, it is preferred that the concentration of the inert gas is set to be within the same concentration range as the above Ar gas concentration. Further, in a case where plural types of inert gases are used, it is preferred that the total concentration of the inert gases is set to be within the same concentration range as the above Ar gas concentration.

The Ta target used for forming the second layer (TaON layer or TaN layer) may contain from 0.1 to 10 at % of B.

The EUV mask blank 1 of the present invention may have a functional film known in the field of EUV mask blanks, in addition to the reflective layer 12, the protective layer 13, the absorber layer 14, and the first layer 16 and the second layer 17 constituting the low reflective layer 15 having a stacked structure. A specific example of such a functional film may, for example, be a high dielectric coating formed on the rear side of a substrate to promote the electrostatic chucking of the substrate, as disclosed in e.g. JP-A-2003-501823. Here, the rear side of the substrate means the surface of the substrate 11 in FIG. 1 on the opposite side to the side where the reflective layer 12 is formed. For the high dielectric coating to be formed on the rear side of the substrate for such a purpose, the electrical conductivity and the thickness of the constituting material are selected so that the sheet resistance will be at most 100Ω/□. The constituting material of the high dielectric coating may be selected widely from those disclosed in known literatures. For example, a high dielectric coating disclosed in JP-A-2003-501823, specifically a coating comprising silicon, TiN, molybdenum, chromium and TaSi may be applied. The thickness of the high dielectric coating may, for example, be from 10 to 1,000 nm.

The high dielectric coating may be formed by means of a publicly known film forming method, e.g. a sputtering method such as a magnetron sputtering method or an ion beam sputtering method, a CVD method, a vacuum deposition method or an electroplating method.

An EUV mask may be produced by at least patterning the absorber layer of the EUV mask blank of the present invention. The method for patterning the absorber layer, is not particularly limited. For example, a method may be employed wherein a resist is applied on the absorber layer to form a resist pattern, and by using it as a mask, the absorber layer is subjected to etching. The material for the resist, or the drawing method for the resist pattern may suitably be selected in consideration of e.g. the material of the absorber layer. Also, the method for etching the absorber layer is not particularly limited, and dry etching such as reactive ion etching, or wet etching may be employed. After patterning the absorber layer, the resist is removed by a remover liquid to obtain an EUV mask.

A process for producing a semiconductor integrated circuit using the EUV mask according to the present invention will be described. The present invention may be applied to a process for producing a semiconductor integrated circuit by means of a photolithography method using EUV light as a light source for exposure. Specifically, a substrate such as a silicon wafer coated with a resist is disposed on a stage, and the above EUV mask is set on a reflection type exposure apparatus combined with a reflecting mirror. And, EUV light from a light source is applied to the EUV mask via the reflecting mirror to have the EUV light reflected by the EUV mask and is applied to the substrate coated with the resist. By such a pattern transfer step, a circuit pattern is transferred to the substrate. The substrate having a circuit pattern transferred thereto is subjected to etching of photosensitive or non-photosensitive portions by development, followed by removal of the resist. A semiconductor integrated circuit is produced by repeating such a process.

EXAMPLES

Now, the present invention will be described in detail with reference to Examples. However, it should be understood that the present invention is by no means limited to these Examples.

Example 1

In this Example, an EUV mask blank 1 as shown in FIG. 1 was prepared.

As a substrate 11 for film formation, a $SiO_2$—$TiO_2$ type glass substrate (shape: about 6 inch square (length×width: about 152 mm×about 152 mm), thickness: about 6.3 mm) was used. This glass substrate has a thermal expansion coefficient of $0.2 \times 10^{-7}$/° C., a Young's modulus of 67 GPa, a Poisson's ratio of 0.17 and a specific rigidity of $3.07 \times 10^7$ m²/s². This glass substrate was polished to form a smooth surface having a surface roughness (rms) of at most 0.15 nm with a planarity of at most 100 nm.

On the rear surface side of the substrate 11, a Cr film having a thickness of 100 nm was formed by a magnetron sputtering method to provide a high dielectric coating having a sheet resistance of 100 Ω/□.

By using the formed Cr film, the substrate 11 was fixed to a usual electrostatic chuck of a flat plate shape, and on the surface of the substrate 11, a Si film and a Mo film were alternately formed by means of an ion beam sputtering method for 40 cycles to form a Mo/Si multilayer reflective film (reflective layer 12) having a total thickness of 272 nm [((4.5 nm (thickness of Si film)+2.3 nm (thickness of Mo film))×40 cycles].

Further, on the Mo/Si multilayer reflective film (reflective layer 12), a Ru film (film thickness: 2.5 nm) was formed by an ion beam sputtering method to form a protective layer 13.

The film forming conditions for the Si film, the Mo film and the Ru film were as follows.
(Film Forming Conditions for Si Film)
  Target: Si target (boron-doped)
  Sputtering gas: Ar gas (gas pressure: 0.02 Pa)
  Voltage: 700 V
  Film forming rate: 0.077 nm/sec
  Film thickness: 4.5 nm
(Film Forming Conditions for Mo Film)
  Target: Mo target
  Sputtering gas: Ar gas (gas pressure: 0.02 Pa)
  Voltage: 700 V
  Film forming rate: 0.064 nm/sec
  Film thickness: 2.3 nm
(Film Forming Conditions for Ru Film)
  Target: Ru target
  Sputtering gas: Ar gas (gas pressure: 0.02 Pa)
  Voltage: 500 V
  Film forming rate: 0.023 nm/sec
  Film thickness: 2.5 nm Then, on the protecting layer 13, a tantalum nitride (TaN) film as the absorber layer 14 was formed by a magnetron sputtering method.

The absorber layer 14 (TaN film) was formed by the following method.
(Film Forming Conditions for Absorber Layer 14 (TaN Film))
  Target: Ta target
  Sputtering gas: mixed gas of Ar, Kr, $H_2$ and $N_2$ (Ar: 41.6 vol %, Kr: 42.9 vol %, $H_2$: 1.3 vol %, $N_2$: 14.3 vol %; gas pressure: 0.3 Pa)
  Applied power: 740 W
  Film forming rate: 7.0 nm/min
  Film thickness: 51 nm
  Degree of vacuum before film formation: $4\times10^{-6}$ Pa The oxygen (O) content in such obtained TaN film was 0.1 at %.

Then, on the absorber layer 14, a first layer 16 (SiN film) of a low reflective layer 15 having a stacked structure, which contained Si and N, was formed by a magnetron sputtering method.

The film forming conditions for the first layer 16 (SiN film) was as follows.
(Film Forming Conditions for First Layer 16 (SiN Film))
  Target: Si target
  Sputtering gas: mixed gas of Ar and $N_2$ (Ar: 43 vol %, $N_2$: 57 vol %, gas pressure: 0.2 Pa)
  Applied power: 450 W
  Film forming rate: 1.05 nm/min
  Film thickness: 11 nm Such obtained SiN film had a Si content of 34 at % and N content of 66 at %.

Then, on the first layer 16, a second layer 17 (TaON film) of the low reflective layer 15, which contains Ta, O and N, was formed by a magnetron sputtering method to obtain an EUV mask blank comprising the substrate 11, and the reflective layer 12, the protective layer 13, the absorber layer 14 and the first layer 16 and the second layer 17 of the low reflective layer 15 having a stacked structure, formed in this order on the substrate 11.

The film forming conditions for the second layer 17 (TaON film) was as follows.
(Film Forming Conditions for Second Layer 17 (TaON Film))
  Target: Ta target
  Sputtering gas: mixed gas of Ar, $O_2$ and $N_2$ (Ar: 49.4 vol %, $O_2$: 36.8 vol %, $N_2$: 13.8 vol %, gas pressure: 0.3 Pa)
  Applied power: 450 W
  Film forming rate: 0.15 nm/min
  Film thickness: 1 nm Such obtained TaON film had a Ta content of 50 at %, an O content of 15 at % and a N content of 35 at %.

The reflectance at 193 nm of the EUV mask blank obtained by the above process was measured, and the result shown in Table 1 was obtained.

An electron beam resist manufactured by Shin-Etsu Chemical Co., Ltd. was applied on the EUV mask blank obtained by the above process so that the film thickness became 130 nm, and then drawing was carried out by means of an electron beam drawing apparatus, followed by development using a 2.38% tetramethylammonium hydroxide (THAH) solution to form a pattern of resist isolated lines having a desired exposure line width as shown in Table 2.

The shape of the resist isolated lines was observed by means of a scanning electron microscope, and the result is shown in Table 2. It was confirmed that lines having a width of from 60 to 250 nm were formed.

The EUV mask blank having the resist isolated line pattern formed by the above process was subjected to dry etching using a $Cl_2$ type gas or a $CF_4$ type gas by means of a reactive ion etching (RIE) apparatus for a prescribed period of time as shown in Table 3 to form a pattern in the absorber layer 14, and the first layer 16 and the second layer 17 constituting the low reflective layer 15 having a stacked structure. In Example 1, two EUV mask blanks were prepared under the same condition, and one of the EUV mask blanks was subjected to two-step etching i.e. etching using a $CF_4$ type gas and then etching using a $Cl_2$ type gas while the other EUV mask blank was subjected to one-step etching using a $Cl_2$ type gas. Etching time of each etching is shown in Table 3. The etching time for the latter etching using a $Cl_2$ type gas is described in parentheses in Table 3.

The etching conditions were as follows.
(Conditions for Etching Using $Cl_2$ Type Gas)
  Bias RF: 50 W
  Trigger pressure: 5 Pa
  Etching pressure: 2 Pa
  Etching gas: $Cl_2$/Ar
  Gas flow rate ($Cl_2$/Ar): 20/80 sccm
(Conditions for Etching Using $CF_4$ Type Gas)
  Bias RF: 50 W
  Trigger pressure: 4 Pa
  Etching pressure: 1 Pa
  Etching gas: $CF_4$
  Gas flow rate ($Cl_4$): 99 sccm The resist remaining after dry etching was removed with a resist remover liquid to obtain an isolated line pattern comprising of the absorber layer 14, and the first layer 16 and the second layer 17 constituting the low reflective layer 15 having a stacked structure.

The line width of the isolated line pattern formed by the above process, which comprises of the absorber layer 14, and the first layer 16 and the second layer 17 constituting the low reflective layer 15 having a stacked structure was observed and measured by means of a scanning electron microscope, and the result is shown in Table 4.

Example 2

In this Example, film formation and evaluation were carried out in the same manner as in Example 1 except that a TaON film having a thickness of 3 nm was formed as the second layer 17, and the etching time was changed as shown in Table 3. Consequently, results shown in Tables 1, 2 and 4 were obtained.

Example 3

In this Example, film formation and evaluation were carried out in the same manner as in Example 1 except that as the second layer 17, a TaN film having a thickness of 1 nm were formed under the same condition as the absorber layer 14, and the etching time was changed as shown in Table 3. Consequently, results shown in Tables 1, 2 and 4 were obtained.

Such obtained TaN film had a Ta content of 57 at % and a N content of 43 at %.

Comparative Example 1

In this Comparative Example, film formation and evaluation were carried out in the same manner as in Example 1 except that the second layer 17 was not formed, and the etching time was changed as shown in Table 3. As a result, results shown in Tables 1, 2 and 4 were obtained.

Comparative Example 2

In this Comparative Example, film formation and evaluation were carried out in the same manner as in Example 1 except that the second layer 17 was not formed, as the first layer 16, a TaON film having a thickness of 10 nm was formed under the same condition as when the TaON film was formed as the second layer 17 in Example 1, and the etching time was changed as shown in Table 3. As a result, results shown in Tables 1, 2 and 4 were obtained. In this Example, a plurality of samples having different thicknesses of the TaON film was prepared, and the reflectance at 193 nm was measured.

TABLE 1

| | | Low reflective layer | | |
|---|---|---|---|---|
| | Absorber layer | The first layer | The second layer | Reflectance at 193 nm |
| Ex. 1 | TaN 51 nm | SiN 11 nm | TaON 1 nm | 3.0% |
| Ex. 2 | TaN 51 nm | SiN 11 nm | TaON 3 nm | 4.5% |
| Ex. 3 | TaN 51 nm | SiN 11 nm | TaN 1 nm | 4.2% |
| Comp. Ex. 1 | TaN 51 nm | SiN 11 nm | — | 3.9% |
| Comp. Ex. 2 | TaN 51 nm | TaON 10 nm | — | 22.0% |

In Table 1, numerical values in the columns of "Absorber layer" and of "Low reflective layer" represent the thickness of the respective layers.

TABLE 2

| Exposure line width (nm) | Ex. 1 SiN/TaON | Ex. 2 SiN/TaON | Ex. 3 SiN/TaN | Comp. Ex. 1 SiN | Comp. Ex. 2 TaON |
|---|---|---|---|---|---|
| 250 | A | A | A | A | A |
| 200 | A | A | A | A | A |
| 150 | A | A | A | A | A |
| 125 | A | A | A | B | A |
| 100 | A | A | A | B | A |
| 80 | A | A | A | C | A |
| 60 | A | A | A | C | A |

Meanings of the symbols in the Table are as follows.
A: Pattern did not fall down or disappear.
B: Pattern partially fell down or disappeared.
C: Pattern disappeared.

TABLE 3

| | Etching process for low reflective layer and absorber layer | Etching time (second) | |
|---|---|---|---|
| | | CF$_4$ type | Cl$_2$ type |
| Ex. 1 | CF$_4$ type/Cl$_2$ type two-step etching, (Cl$_2$ type one-step etching) | 5 (0) | 302 (312) |
| Ex. 2 | CF$_4$ type/Cl$_2$ type two-step etching | 15 | 302 |
| Ex. 3 | Cl$_2$ type one-step etching | — | 307 |
| Comp. Ex. 1 | Cl$_2$ type one-step etching | — | 302 |
| Comp. Ex. 2 | CF$_4$ type/Cl$_2$ type two-step etching | 50 | 248 |

TABLE 4

| Exposure line width (nm) | Ex. 1 SiN/TaON | Ex. 2 SiN/TaON | Ex. 3 SiN/TaN | Comp. Ex. 1 SiN | Comp. Ex. 2 TaON |
|---|---|---|---|---|---|
| 250 | 254 | 255 | 252 | 256 | 253 |
| 200 | 202 | 200 | 204 | 205 | 202 |
| 150 | 149 | 152 | 155 | 143 | 151 |
| 125 | 126 | 121 | 122 | Unmeasurable | 124 |
| 100 | 97 | 102 | 97 | Unmeasurable | 99 |
| 80 | 79 | 81 | 82 | Unmeasurable | 77 |
| 60 | 58 | 57 | 59 | Unmeasurable | 58 |

The EUV mask blank in the Comparative Example 2 has the most common construction. However, even when the thickness is variously changed, it is not possible to obtain a reflectance of at most 15%, preferably at most 10%, more preferably at most 5%, at 193 nm.

The EUV mask blank in the Comparative Example 1 has a construction wherein SiN was employed as the low reflective film, and a low reflectance at 193 nm can thereby be obtained as shown in Table 1. However, as shown by the results in Tables 2 and 4, when a fine resist pattern having a width of about 100 nm or less is formed, the resist pattern may disappear or may falls down due to lack of adhesion of the resist, which leads to trouble.

In Examples 1, 2 and 3, the reflectance at 193 nm is at most 5%, which is preferable, and when a fine resist pattern having a width of about 100 nm or less is formed, the resist pattern will not disappear or fall down due to lack of adhesion of the resist, and therefore it is possible to form a fine pattern.

Further, in Examples 1, 2 and 3, the surfaces of the second layers were smooth, which had surface roughnesses (rms) of 28.8 nm, 27.6 nm and 29.6 nm, respectively.

INDUSTRIAL APPLICABILITY

The EUV mask blank of the present invention has low reflectance at the wavelength region of pattern inspection light, has a sufficient etching rate in an etching process, and has good adhesion with a resist. Further, when a fine resist pattern having a width of about 100 nm or less is formed, the resist pattern will not disappear, or the resist pattern will not fall down to arise a defect, and thus it is useful as an EUV mask blank for an EUV mask used for production of a semiconductor integrated circuit which is required to be high-accuracy and high-density.

This application is a continuation of PCT Application No. PCT/JP2011/054380, filed on Feb. 25, 2011, which is based upon and claims the benefit of priority from Japanese Patent Application No. 2010-045059 filed on Mar. 2, 2010. The contents of those applications are incorporated herein by reference in its entirety.

REFERENCE SYMBOLS

1: EUV mask blank
11: Substrate
12: Reflective layer (multilayer reflective film)
13: Protective layer
14: Absorber layer
15: Low reflective layer
16: First layer
17: Second layer

What is claimed is:

1. A reflective mask blank for EUV lithography comprising a substrate, and a reflective layer for reflecting EUV light, an absorber layer for absorbing EUV light and a low reflective layer to an inspection light (wavelength: 190 to 260 nm) for a mask pattern, formed in this order on the substrate, wherein the low reflective layer has a stacked structure having a first layer containing at least 95 at % in total of silicon (Si) and nitrogen (N) and a second layer containing at least 95 at % in total of tantalum (Ta), oxygen (O) and nitrogen (N), stacked in this order from the absorber layer side.

2. The reflective mask blank for EUV lithography according to claim 1, wherein in the second layer, the Ta content is from 30 to 80 at %, the total content of O and N is from 20 to 70 at %, and the compositional ratio of O to N is from 9:1 to 1:9.

3. The reflective mask blank for EUV lithography according to claim 1, wherein the first layer is formed by carrying out a sputtering method using a Si target in an inert gas atmosphere containing nitrogen (N) or carrying out a sputtering method using a SiN target in an inert gas atmosphere, and the second layer is formed by carrying out a sputtering method using a Ta target in an inert gas atmosphere containing nitrogen (N) and oxygen (O).

4. A reflective mask blank for EUV lithography comprising a substrate, and a reflective layer for reflecting EUV light, an absorber layer for absorbing EUV light and a low reflective layer to an inspection light (wavelength: 190 to 260 nm) for a mask pattern, formed in this order on the substrate, wherein the low reflective layer has a stacked structure having a first layer containing at least 95 at % in total of silicon (Si) and nitrogen (N) and a second layer containing at least 95 at % in total of tantalum (Ta) and nitrogen (N), stacked in this order from the absorber layer side.

5. The reflective mask blank for EUV lithography according to claim 4, wherein in the second layer, the Ta content is from 30 to 80 at %, and the N content is from 20 to 70 at %.

6. The reflective mask blank for EUV lithography according to claim 4, wherein the first layer is formed by carrying out a sputtering method using a Si target in an inert gas atmosphere containing nitrogen (N) or carrying out a sputtering method using a SiN target in an inert gas atmosphere, and the second layer is formed by carrying out a sputtering method using a Ta target in an inert gas atmosphere containing nitrogen (N).

7. The reflective mask blank for EUV lithography according to claim 1, wherein in the first layer, the Si content is from 5 to 80 at %, and the N content is from 15 to 90 at %.

8. The reflective mask blank for EUV lithography according to claim 1, wherein the surface roughness (rms) of the surface of the second layer is at most 0.5 nm.

9. The reflective mask blank for EUV lithography according to claim 1, wherein the crystal structure of the first layer and the second layer is amorphous.

10. The reflective mask blank for EUV lithography according to claim 1, wherein the total thickness of the first layer and the second layer is from 3.5 to 23 nm.

11. The reflective mask blank for EUV lithography according to claim 1, wherein the thickness of the first layer is from 3 to 18 nm, and the thickness of the second layer is from 0.5 to 5 nm, provided that the difference between the thickness of the first layer and the thickness of the second layer (thickness of the first layer—thickness of the second layer) is at least 2 nm.

12. The reflective mask blank for EUV lithography according to claim 1, wherein the absorber layer is composed mainly of tantalum (Ta).

13. The reflective mask blank for EUV lithography according to claim 1, wherein the absorber layer is composed mainly of tantalum (Ta) and contains at least one element selected from the group consisting of hafnium (Hf), silicon (Si), zirconium (Zr), germanium (Ge), boron (B), nitrogen (N) and hydrogen (H).

14. The reflective mask blank for EUV lithography according to claim 1, wherein the absorber layer contains less than 25 at % of oxygen (O).

15. The reflective mask blank for EUV lithography according to claim 1, wherein the total thickness of the absorber layer and the low reflective layer is from 40 to 200 nm.

16. The reflective mask blank for EUV lithography according to claim 1, which has a protective layer for protecting the reflective layer at the time of forming a pattern in the absorber layer, formed between the reflective layer and the absorber layer, wherein the protective layer is formed from one member selected from Ru, a Ru compound, $SiO_2$ and CrN.

17. The reflective mask blank for EUV lithography according to claim 1, wherein the reflectance of the inspection light for a mask pattern having the wavelength (190 to 260 nm) is at most 15% at the surface of the low reflective layer.

18. A process for producing a reflective mask blank for EUV lithography, which comprises forming a reflective layer for reflecting EUV light, an absorber layer for absorbing EUV light, and a first layer and a second layer of a low reflective layer to an inspection light (wavelength: 190 to 260 nm) for a mask pattern, in this order on a substrate, wherein the first layer is formed by carrying out a sputtering method using a Si target in an inert gas atmosphere containing nitrogen (N) or carrying out a sputtering method using a SiN target in an inert gas atmosphere, and the second layer is formed by carrying out a sputtering method using a Ta target in an inert gas atmosphere containing nitrogen (N) and oxygen (O).

19. A process for producing a reflective mask blank for EUV lithography, which comprises forming a reflective layer for reflecting EUV light, an absorber layer for absorbing EUV light, and a first layer and a second layer of a low reflective layer to an inspection light (wavelength: 190 to 260 nm) for a mask pattern, in this order on a substrate, wherein the first layer is formed by carrying out a sputtering method using a Si target in an inert gas atmosphere containing nitrogen (N) or carrying out a sputtering method using a SiN target in an inert gas atmosphere, and the second layer is formed by carrying out a sputtering method using a Ta target in an inert gas atmosphere containing nitrogen (N).

20. A reflective mask for EUV lithography, which is obtained by subjecting to patterning the absorber layer and the low reflective layer of the reflective mask blank for EUV lithography as defined in claim 1.

21. A process for producing a semiconductor integrated circuit, which comprises subjecting an object to be exposed to exposure by means of the reflective mask for EUV lithography as defined in claim 20.

* * * * *